(12) United States Patent
Ikeda et al.

(10) Patent No.: US 7,663,239 B2
(45) Date of Patent: Feb. 16, 2010

(54) SEMICONDUCTOR DEVICE AND METHOD FOR FABRICATING THE SAME

(75) Inventors: Atsushi Ikeda, Shiga (JP); Hideo Nakagawa, Shiga (JP); Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 581 days.

(21) Appl. No.: 11/630,799

(22) PCT Filed: May 20, 2005

(86) PCT No.: PCT/JP2005/009270

§ 371 (c)(1),
(2), (4) Date: Dec. 27, 2006

(87) PCT Pub. No.: WO2006/003760

PCT Pub. Date: Dec. 1, 2006

(65) Prior Publication Data

US 2008/0054464 A1    Mar. 6, 2008

(30) Foreign Application Priority Data

Jun. 30, 2004    (JP) .............................. 2004-192653

(51) Int. Cl.
*H01L 23/48*   (2006.01)
*H01L 23/52*   (2006.01)
*H01L 29/40*   (2006.01)
*H01L 21/44*   (2006.01)

(52) U.S. Cl. .............................. 257/751; 257/E21.476; 257/E23.01; 257/758; 438/608

(58) Field of Classification Search ................. 257/751, 257/E21.476, E23.01, 758; 438/608
See application file for complete search history.

(56) References Cited

U.S. PATENT DOCUMENTS

| 6,069,068 | A  | * | 5/2000  | Rathore et al. | 438/628 |
| 6,433,379 | B1 | * | 8/2002  | Lopatin et al. | 257/301 |
| 6,713,373 | B1 | * | 3/2004  | Omstead | 438/608 |
| 2002/0036309 | A1 | * | 3/2002 | Sekiguchi et al. | 257/301 |
| 2003/0205825 | A1 | * | 11/2003 | Fujisawa et al. | 257/774 |
| 2003/0214043 | A1 |  | 11/2003 | Saitoh et al. | |
| 2005/0206000 | A1 | * | 9/2005  | Aggarwal et al. | 257/758 |
| 2006/0138669 | A1 | * | 6/2006  | Lee | 257/762 |
| 2007/0298608 | A1 | * | 12/2007 | Johnston et al. | 438/643 |

FOREIGN PATENT DOCUMENTS

| JP | 8-316233 A  | 11/1996 |
| JP | 10-229084 A | 8/1998  |
| JP | 11-223755 A | 8/1999  |

(Continued)

*Primary Examiner*—Zandra V. Smith
*Assistant Examiner*—Igwe U Anya
(74) *Attorney, Agent, or Firm*—McDermott Will & Emery LLP

(57) ABSTRACT

In a semiconductor device including: an insulating film (6) formed over a substrate (1); a buried metal interconnect (10) formed in the insulating film (6); and a barrier metal film (A1) formed between the insulating film (6) and the metal interconnect (10), the barrier metal film (A1) includes a metal oxide film (7), a metal compound film (8) and a metal film (9) stacked in this order from a side in which the insulating film (6) exists to a side in which the metal interconnect (10) exists. Elastic modulus of the metal compound film (8) is larger than that of the metal oxide film (7).

20 Claims, 5 Drawing Sheets

FOREIGN PATENT DOCUMENTS

| | | |
|---|---|---|
| JP | 2000-195954 A | 7/2000 |
| JP | 2000-208443 A | 7/2000 |
| JP | 2002-43419 A | 2/2002 |
| JP | 2002-75994 A | 3/2002 |
| JP | 3409831 | 3/2003 |
| JP | 2003-332426 A | 11/2003 |
| JP | 2004-31497 A | 1/2004 |
| JP | 2004-31866 A | 1/2004 |
| JP | 2004-40128 A | 2/2004 |

* cited by examiner

SEMICONDUCTOR DEVICE AND METHOD FOR FABRICATING THE SAME

RELATED APPLICATIONS

This application is the U.S. National Phase under 35 U.S.C. § 371 of International Application No. PCT/JP2005/009270, filed on May 20, 2005, which in turn claims the benefit of Japanese Application No. 2004-192653, filed on Jun. 30, 2004, the disclosures of which Applications are incorporated by reference herein.

TECHNICAL FIELD

The present invention relates to a semiconductor device including a copper interconnect and a method for fabricating the semiconductor device, and more particularly relates to a barrier metal film and a method for forming the barrier metal film.

BACKGROUND ART

In recent years, as the processing size of semiconductor integrated circuit devices (which will be referred to as "semiconductor devices") has been reduced, a combination of a copper interconnect and an insulating film having a small dielectric constant, i.e., a so-called low-k film has been used for multilayer interconnects of semiconductor devices. Use of such combination for multilayer interconnects allows reduction in RC delay and in power consumption. Furthermore, to achieve increase in the integration, function and operation speed of semiconductor devices, use of a low-k film having a lower dielectric constant has been under examination.

Copper interconnects are normally formed by damascene process. There are two types of damascene process, i.e., single damascene process in which an interconnect and a via plug are alternately formed and dual damascene process in which an interconnect and via plug are simultaneously formed.

Hereafter, a method for forming a multilayer interconnect employing damascene process will be described with reference to FIGS. 5(a) and 5(b).

As shown in FIG. 5(a), a first insulating film 102 is formed on a silicon substrate 101 and then a first copper interconnect 104 including a first barrier metal 103 is formed in the first insulating film 102. Note that transistors and the like, which are not shown in FIGS. 5(a) and 5(b), are formed over the silicon substrate 101. Then, a diffusion barrier film 105 for preventing diffusion of copper and a second insulating film 106 are formed in this order over the first insulating film 102 and the first copper interconnect 104. Subsequently, a via hole 106a is formed in the diffusion barrier film 105 and the second insulating film 106 and an interconnect trench 106b is formed in the second insulating film 106, thereby forming a recess portion 106c including the via hole 106a and the r interconnect trench 106b. Thereafter, a second barrier metal film 107 is formed so as to extend over wall surfaces of the recess portion 106c. In FIG. 5(a), as an upper barrier metal structure, the case where the second barrier metal film 107 has a single layer structure is shown. However, as shown in FIG. 5(b), a two-layer structure of a second barrier metal film 108 and a third barrier metal film 109 may be formed so as to extend over the wall surfaces of the recess portion 106c.

Next, although not shown in the drawings, in the case of FIG. 5(a), a copper seed layer is formed on the second barrier metal film 107 (the third barrier metal film 109 in the case of FIG. 5(b)) and then the recess portion 106c is filled by copper plating using the seed layer as a seed and a copper film is formed so as to cover an entire surface of the second insulating film 106. Subsequently, CMP (chemical mechanical polishing) is performed to remove part of the copper film which is other than part of the copper film located inside of the recess portion 106c and is located over the second insulating film 106 and, in the case of FIG. 5(a) and part of the second barrier metal film 107 which is other than part of the second barrier metal film 107 located inside of the recess portion 106c and is formed on the second insulating film 106 (in the case of FIG. 5(b), parts of the third barrier metal film 109 and the second barrier metal film 108 which are other than parts thereof located inside of the recess portion 106c and are located on the second insulating film 106). Thus, one or both of an interconnect and a via plug can be formed. By repeating a series of this operation, a multilayer interconnect can be formed (see, for example, Patent Reference 1).

In general, copper is easily defused in an insulating film such as a silicon oxide film by heat or electric field and this causes degradation of characteristics of transistors in many cases. Moreover, copper has a poor adhesiveness with an insulating film. Accordingly, a method in which in forming a copper interconnect, a barrier metal film including a tantalum film or a tantalum nitride film is formed between copper and an insulating film to prevent diffusion of copper into the insulating film and improve an adhesiveness between the insulating film and the copper has been proposed (see, for example, Patent Reference 2). For example, the case where a barrier metal film has a single-layer structure of a tantalum film or a tantalum nitride film corresponds to the structure of FIG. 5(a) and the case where a barrier metal film has a two-layer structure including a tantalum film and a tantalum nitride film corresponds to the structure of FIG. 5(b).

However, for example, in the above-described example, when a high melting point metal film such as tantalum is used as the second barrier metal film 107 shown in FIG. 5(a), an adhesiveness between the second insulating film 106 including the recess portion 106c and the high melting point film is poor. To cope with the problem of the poor adhesiveness, for example, when a tantalum film is used as the third barrier metal film 109, as shown in FIG. 5(b), a tantalum nitride film is formed as the second barrier metal film 108 between the third barrier metal film 109 of a tantalum film and the second insulating film 106 to improve this poor adhesiveness. However, a sufficient adhesiveness can not be achieved by this method.

When a tantalum nitride film is used as the second barrier metal film 107 (in the case of FIG. 5(a)) or the third barrier metal film 109 (in the case of FIG. 5(b)), the tantalum nitride film is not oxidized but the tantalum nitride film has a high resistance and the problem of the poor adhesiveness is still left.

Furthermore, when a titanium film or a titanium nitride film is used as the second barrier metal film 107 (in the case of FIG. 5(a)) or the third barrier metal film 109 (in the case of FIG. 5(b)), the same problem as that in the above-described case where a tantalum film is used arises.

In forming the copper seed layer, PVD (physical vapor deposition) is normally used. With reduction in the size of semiconductor devices, an aspect ratio (i.e., the ratio between the depth and diameter of a via hole) of a via hole tends to be increased. Therefore, when a copper seed layer is formed using PVD, it is difficult to ensure a sufficient thickness of part of the copper seed layer located at the bottom of the via hole. When the part of the copper seed layer at the bottom of the via hold has a small thickness, a current for electrolytic plating can not be sufficiently supplied, so that the via hole can not be sufficiently filled by copper through electrolytic plating. For example, in the case of FIG. 5(a), the recess portion 106c including the via hold 106a and the interconnect trench 106b can not be filled by copper. Accordingly, product yield and reliability are reduced. In view of this point, to ensure a sufficient thickness of part of the copper seed layer at the bottom of the via hole, formation of the copper layer using CVD (chemical vapor deposition) has been examined. However, there are many cases where a substance, such as fluorine (F) and the like, which causes corrosion of copper is contained in a source gas, and thus this method has not been put in practical use yet.

Trial of forming a copper interconnect directly on a barrier metal film by electrolytic plating without using a copper seed layer has been under consideration.

However, for example, when a high-melting point metal film such as a tantalum film is used as the second barrier metal film 107 (in the case of FIG. 5(a)) or the third barrier metal film 109 (in the case of FIG. 5(b)) in the above-described example, in forming copper by electrolytic plating, tantalum is oxidized, so that a tantalum oxide film having a high resistance is formed. Therefore, increase in interconnect resistance can not be avoided.

To realize reduction in resistance of a barrier metal film, use of a metal which does not lose its conductivity even when being oxidized and a metal such as ruthenium, iridium and the like of which oxide itself has a low resistance draw attentions (see, for example, Patent References 3 an 4). Such a metal has a lower resistance than that of tantalum or tantalum nitride and does not lose its conductivity even when being oxidized. Therefore, without using a copper seed layer, copper plating can be directly performed onto the barrier metal film. Note that in general, such a metal is formed by atomic layer epitaxy or chemical vapor deposition.

Patent Reference 1: Japanese Laid-Open Publication No. 11-223755
Patent Reference 2: Japanese Laid-Open Publication No. 2002-43419
Patent Reference 3: Japanese Patent No. 3409831
Patent Reference 4: Japanese Laid-Open Publication No. 2002-75994

DISCLOSURE OF THE INVENTION

Problems that the Invention is to Solve

In view of the above-described points, to achieve reduction in resistance of a barrier metal film, when a metal such as ruthenium, iridium or the like is formed as a barrier metal film directly on an insulating film. However, in such a case, since an adhesiveness between such a metal and the insulating film is poor, the barrier metal film is exfoliated from the insulating film.

In this case, as a method for increasing an adhesiveness between the barrier metal film and the insulating film, a barrier metal film including a metal oxide film having conductivity and a metal film which does not lose its conductivity even when being oxidized is used. In the barrier metal film, the metal oxide film and the metal film are formed in this order on a side in which the insulating film exists. Thus, when a silicon oxide film is used as the insulating film, oxygen constituting the insulating film and oxygen constituting the metal oxide film are the same kind of element and thus it is considered that the adhesiveness between the insulating film and the metal oxide film is increased. Furthermore, when the metal film which does not lose its conductivity even when being oxidized is formed on an uppermost surface of the barrier metal film, the metal film which does not lose its conductivity serves as an electrode for electrolytic plating, so that a resistance of the barrier metal film can be reduced. Therefore, the barrier metal film having a high adhesiveness with an insulating film and a low resistance can be achieved.

However, in general, it has been known that a mechanical strength of a metal oxide is low. Therefore, as descried above, when a lamination film including a metal film which does not lose its conductivity even when being oxidized and a metal oxide film is used as a barrier metal film, for example, under the assumption that the metal oxide film is used as the second barrier metal film 108 of FIG. 5(b) and a metal such as ruthenium or iridium is used as the third barrier metal film 109, cracks are generated in the barrier metal film due to thermal treatment performed in semiconductor fabrication process steps, a via resistance or an interconnect resistance is increased, or reliability of an interconnect is reduced due to electro-migration or stress-migration.

Moreover, for example, when metal oxide such as ruthenium oxide, iridium oxide or the like is used as the second gate electrode 108 of FIG. 5(b), a barrier metal film having a low resistance and an excellent adhesiveness with the insulating film can be achieved. However, a mechanical strength of the barrier metal film is reduced. If the mechanical strength of the barrier metal film is small, cracks are generated in the barrier metal film due to thermal treatment of the semiconductor process steps, an interconnect resistance is increased or reliability of an interconnect is reduced due to electro-migration or stress-migration. Furthermore, when wire bonding is performed in an assembly step, cracks are generated in the barrier metal film.

In view of the above-described problems, the present invention has been devised and it is therefore an object of the present invention to provide a semiconductor device including a barrier metal film having an excellent mechanical strength, a low resistance and a high adhesiveness with an insulating film and a method for fabricating the semiconductor device.

Solution to the Problems

To solve the above-described problems, a first semiconductor device according to the present invention is directed to a semiconductor device including an insulating film formed on a substrate, a buried metal interconnect formed in the insulating film, and a barrier metal film formed between the insulating film and the metal interconnect, and is characterized in that the barrier metal film includes a metal oxide film, a metal compound film and a metal film stacked in this order from a side in which the insulating film exists to a side in which the metal interconnect exists, and elastic modulus of the metal compound film is larger than that of the metal oxide film.

In the first semiconductor device of the present invention, the barrier metal film includes the metal compound film having larger elastic modulus than that of the metal oxide film and a high mechanical strength between the metal oxide film and the metal film. Thus, compared to a barrier metal film formed by merely stacking a metal film and a metal oxide film, the mechanical strength is dramatically improved. Therefore, a highly reliable semiconductor device including a multilayer interconnect having an excellent mechanical strength can be achieved.

In the first semiconductor device of the present invention, it is preferable that the insulating film and the metal oxide film are formed so as to be in contact with each other, and the metal film and the metal interconnect are formed so as to be in contact with each other.

Thus, since the metal oxide film and the insulating film are in contact with each other, an adhesiveness of the barrier metal film with the insulating film is improved, compared to the case where the metal film and the insulating film are in contact with each other. Furthermore, when an uppermost surface of the insulating film is an oxide, a common element, i.e., oxygen exists in each of the metal oxide film and the insulating film so that an adhesiveness between the insulating film and the metal oxide film is increased. Also, since the metal film and the metal interconnect are in contact with each other, a metal having a smaller resistance than that of the metal compound film or the metal oxide film serves as an electrode and a plating underlying layer in performing metal plating. Thus, a plating film having excellent uniformity in thickness can be formed, compared to the case where the metal compound film or the metal oxide film is formed on the surface of the barrier metal film. Therefore, excellent metal plating can be realized.

In the first semiconductor device of the present invention, it is preferable that the metal oxide film has conductivity.

Thus, the adhesiveness between the oxide film and the insulating film can be increased and, in addition to that, a barrier metal film having a low resistance can be achieved. Thus, a highly reliable semiconductor device including a multilayer interconnect having a low resistance and a high adhesiveness can be achieved.

A second semiconductor device according to the present invention is directed to a semiconductor device including an insulating film formed over a substrate, a buried metal interconnect formed in the insulating film, and a barrier metal film formed between the insulating film and the metal interconnect, and is characterized in that the barrier metal film includes a first metal oxide film, a metal compound film, a second metal oxide film and a metal film stacked in this order from a side in which the insulating film exists to a side in which the metal interconnect exists, and elastic modulus of the metal compound film is larger than those of the first metal oxide film and the second metal oxide film.

In the second semiconductor device of the present invention, the barrier metal film includes the metal compound film between the first metal oxide film and the metal film and the second metal oxide film between the metal film and the metal compound film and the metal compound film has larger elastic modulus than those of the first metal oxide film and the second metal oxide film. Thus, a barrier metal film having an excellent mechanical strength can be achieved. Therefore, compared to a barrier metal film formed by merely stacking a metal film and a metal oxide film, the mechanical strength is dramatically improved. Moreover, even when the metal compound film has a different thermal expansion coefficient from that of each of the first metal oxide film and the second metal oxide film, thermal expansion of the entire barrier metal film is made uniform, so that a structure of the barrier metal film having an excellent mechanical strength can be realized. Furthermore, the barrier metal film has a structure in which the first metal oxide film, the metal compound film and the second metal oxide film are stacked in this order. Thus, stress applied to the metal oxide film is dispersed into two layers, so that the mechanical strength of the entire barrier metal film is dramatically increased. Therefore, a highly reliable semiconductor device including a multilayer interconnect having an excellent mechanical strength can be achieved.

In the second semiconductor device of the present invention, it is preferable that the insulating film and the first metal oxide film are formed so as to be in contact with each other, and the metal film and the metal interconnect are formed to be in contact with each other.

Thus, since the first metal oxide film and the insulating film are in contact with each other, an adhesiveness between the barrier metal film and the insulating film is improved, compared to the case where the metal film and the insulating film are in contact with each other. Furthermore, when an uppermost surface of the insulating film is an oxide, a common element, i.e., oxygen exists in each of the first metal oxide film and the insulating film. Thus, an adhesiveness between the insulating film and the first metal oxide film is increased. Also, since the metal film and the metal interconnect are in contact with each other, a metal having a smaller resistance than that of the metal compound film or the metal oxide film serves as an electrode and a plating underlying layer in performing metal plating. Thus, a plating film having excellent uniformity in thickness can be formed, compared to the case where the metal compound film or the metal oxide film is formed on the surface of the barrier metal film. Therefore, excellent metal plating can be realized.

In the second semiconductor device, it is preferable that at least one of the first metal oxide film and the second metal oxide film has conductivity.

Thus, an adhesiveness of at least one of the first metal oxide film and the second metal oxide film with the insulating film can be increased and, in addition to that, a barrier metal film having a low resistance can be achieved. Therefore, a highly reliable semiconductor device including a multilayer interconnect having a low resistance and an excellent adhesiveness can be achieved.

In the first or second semiconductor device of the present invention, it is preferable that a metal constituting the metal compound film is a high-melting point metal.

Thus, even when after formation of the second copper interconnect 10, heat at a temperature of around 400° C. is applied in the step of forming an upper layer interconnect, deformation of the metal compound film does not occur, so that the generation of cracks in the barrier metal film can be suppressed. Moreover, a mechanical strength of the metal compound film formed of a high-melting point metal is high and, even if stress is applied in performing wire bonding in the step of assembly, the generation of cracks in the barrier metal film can be suppressed. Therefore, a highly reliable semiconductor device having an excellent mechanical strength can be achieved.

In the first or second semiconductor device of the present invention, it is preferable that a metal constituting the metal film is a metal which does not lose its conductivity even when being oxidized.

Thus, the metal film is formed of a metal which does not lose its conductivity, so that the conductivity is not reduced even when a surface of the metal film is oxidized in performing plating. This allows excellent metal plating. Therefore, a highly reliable semiconductor device including a multilayer interconnect having a low resistance and a high adhesiveness can be achieved.

In the first or second semiconductor device of the present invention, it is preferable that the metal compound film is formed of a metal nitride film.

Thus, the metal nitride film having a more excellent mechanical strength than that of the metal oxide film exists between the metal film and the metal oxide film, so that the mechanical strength of the entire barrier metal film is increased. Therefore, a highly reliable semiconductor device including a multilayer interconnect having a low resistance and a high adhesiveness can be achieved.

In the first or second semiconductor device of the present invention, it is preferable that the metal compound film is formed of a metal carbide film.

Thus, the metal carbide film having a more excellent mechanical strength than that of the metal oxide film exists between the metal film and the metal oxide film, so that a mechanical strength of the entire barrier metal film is increased. Therefore, a highly reliable semiconductor device including a multilayer interconnect having an excellent mechanical strength, a low resistance and a high adhesiveness can be achieved.

In the first or second semiconductor device of the present invention, it is preferable that the metal compound film is formed of a metal silicide film.

Thus, the metal silicide film having a more excellent mechanical strength than that of the metal oxide film exists between the metal film and the metal oxide film, so that a mechanical strength of the entire barrier metal film is increased. Therefore, a highly reliable semiconductor device including a multilayer interconnect having an excellent mechanical strength, a low resistance and a high adhesiveness can be achieved.

A first method for fabricating a semiconductor device according to the present invention is characterized by including the steps of: forming a recess portion in an insulating film on a substrate; forming a barrier metal film including a metal oxide film, a metal compound film and a metal film stacked in this order so that the barrier metal film extends over wall surfaces of the recess portion; and forming a buried metal interconnect on the barrier metal film so that the recess portion is filled, and that the step of forming the barrier metal film includes a sub-step of forming the metal compound film having larger elastic modulus than that of the metal oxide film.

According to the first method for fabricating a semiconductor device according to the present invention, a barrier metal film including a metal compound film having larger elastic modulus than that of the metal oxide film and an excellent mechanical strength is formed between the metal oxide film and the metal film. Thus, compared to the case where a barrier metal film is formed by merely stacking a metal film and a metal oxide film, the mechanical strength is dramatically increased. Therefore, a highly reliable semiconductor device including a multilayer interconnect having an excellent mechanical strength can be fabricated. Moreover, by forming a metal oxide film and an insulating film so as to be in contact to each other, an adhesive of the barrier metal film with the insulating film can be increased. Also, when an uppermost surface of the insulating film is an oxide, a common element, i.e., oxygen exists in each of the metal oxide film and the insulating film so that an adhesiveness between the insulating film and the metal oxide film is increased. Furthermore, by forming the metal film and the metal interconnect so that they are in contact with each other, a metal having a smaller resistance than that of the metal compound film or the metal oxide film serves as an electrode and a plating underlying layer in performing metal plating. Thus, a plating film having excellent uniformity in thickness can be formed, compared to the case where a metal compound film or a metal oxide film is formed on the surface of the barrier metal film. Therefore, excellent metal plating can be realized.

A second method for fabricating a semiconductor device according to the present invention is characterized by including the steps of: forming a recess portion in an insulating film on a substrate; forming a barrier metal film including a first metal oxide film, a metal compound film, a second metal oxide film and a metal film stacked in this order so that the barrier metal film extends over wall surfaces of the recess portion; and forming a buried metal interconnect on the barrier metal film so that the recess portion is filled, and that the step of forming the barrier metal film includes a sub-step of forming the metal compound film having larger elastic modulus than those of the first metal oxide film and the second metal oxide film.

According to the second method for fabricating a semiconductor device according to the present invention, a barrier metal film including a metal compound film between a first metal oxide film and a metal film and a second metal compound film between the metal film and the metal compound film is formed and the metal compound film is formed so as to have larger elastic modulus than those of the first metal oxide film and the second metal oxide film. Thus, a barrier metal film having an excellent mechanical strength can be achieved. Therefore, compared to a barrier metal film formed by merely stacking a metal film and a metal oxide film, the mechanical strength is dramatically improved. Moreover, even when the metal compound film has a different thermal expansion coefficient from that of each of the first metal oxide film and the second metal oxide film, thermal expansion of the entire barrier metal film is made uniform, so that a structure of the barrier metal film having an excellent mechanical strength can be realized. Furthermore, the barrier metal film has a structure in which the first metal oxide film, the metal compound film and the second metal oxide film are stacked in this order. Thus, stress applied to the metal oxide film is dispersed into two layers, so that the mechanical strength of the entire barrier metal film is dramatically increased. Therefore, a highly reliable semiconductor device including a multilayer interconnect having an excellent mechanical strength can be achieved. Moreover, by forming the first metal oxide film and the insulating film so that they are in contact with each other, an adhesiveness between the barrier metal film and the insulating film is improved. Furthermore, when an uppermost surface of the insulating film is an oxide, a common element, i.e., oxygen exists in each of the first metal oxide film and the insulating film so that an adhesiveness between the insulating film and the first metal oxide film is increased. Furthermore, by forming the metal film and the metal interconnect so that they are in contact with each other, a metal having a smaller resistance than that of the metal compound film or the metal oxide film serves as an electrode and a plating underlying layer in performing metal plating. Thus, a plating film having excellent uniformity in thickness can be formed, compared to the case where the metal compound film or the metal oxide film is formed on the surface of the barrier metal film. Therefore, excellent metal plating can be realized.

In the first or second method for fabricating a semiconductor device according to the present invention, it is preferable that the method further includes, after the step of forming the barrier metal film and before the step of forming the buried metal interconnect, the step of forming a seed layer on the barrier metal film, and the step of forming the buried metal interconnect includes a sub-step of forming the burrier metal interconnect on the seed layer.

Thus, a process window for plating for an interconnect is enlarged, so that optimization of the step of forming the buried metal interconnect can be facilitated, compared to the case there a buried metal interconnect is formed without forming a seed layer. Therefore, production yield is improved and a highly reliable semiconductor device including a multilayer interconnect having a low resistance and a high adhesiveness can be achieved.

Effects of the Invention

With a semiconductor device according to the present invention and a method for fabricating the semiconductor device, a highly reliable semiconductor device including a multilayer interconnect having an excellent mechanical strength, a low resistance and a high adhesiveness can be achieved.

Figure 1A:
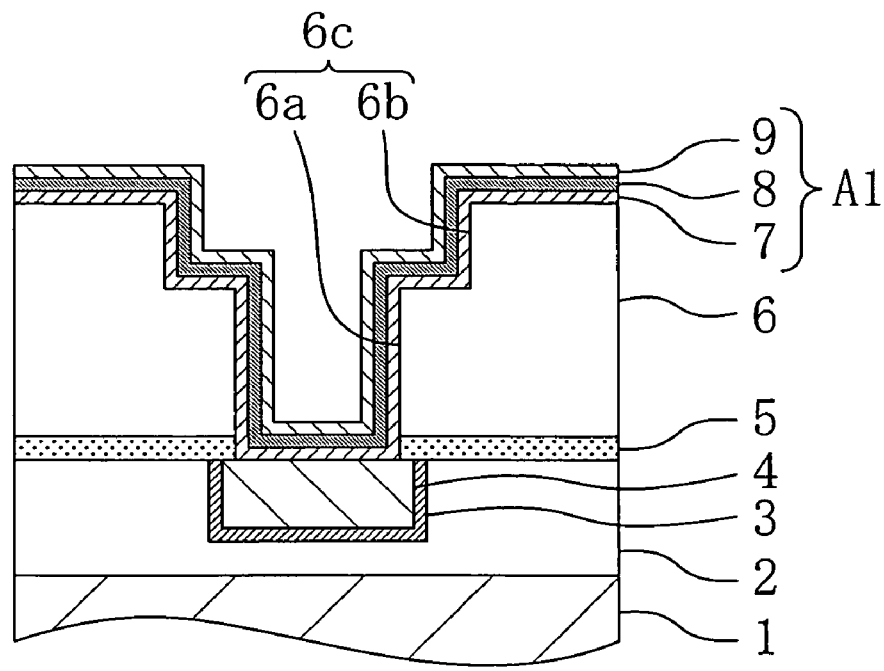
FIGS. 1(a) and 1(b) are cross-sectional views illustrating major part of a structure of a semiconductor device according to a first embodiment of the present invention.

EXPLANATION OF REFERENCE NUMERALS 1 silicon substrate
2 first insulating film
3 first barrier metal film
4 first copper interconnect
5 diffusion barrier film
6 second insulating film
6a via hole
6b interconnect trench
6c recess portion
7 metal oxide film
7a first metal oxide film
7b second metal oxide film
8 metal compound film
9 metal film
10 second copper interconnect
A1, A2 second barrier metal film
101 silicon substrate
102 first insulating film
103 first barrier metal
104 first copper interconnect
105 diffusion barrier film
106 second insulating film
106a via hole
106b interconnect trench
106c recess portion
107, 108 second barrier metal film
109 third barrier metal film

BEST MODE FOR CARRYING OUT THE INVENTION

First Embodiment

Hereafter, a semiconductor device according to a first embodiment of the present invention and a method for fabricating the semiconductor device will be described with reference to FIGS. 1(a) and 1(b) and FIGS. 2(a) through 2(c).

Figure 1B:
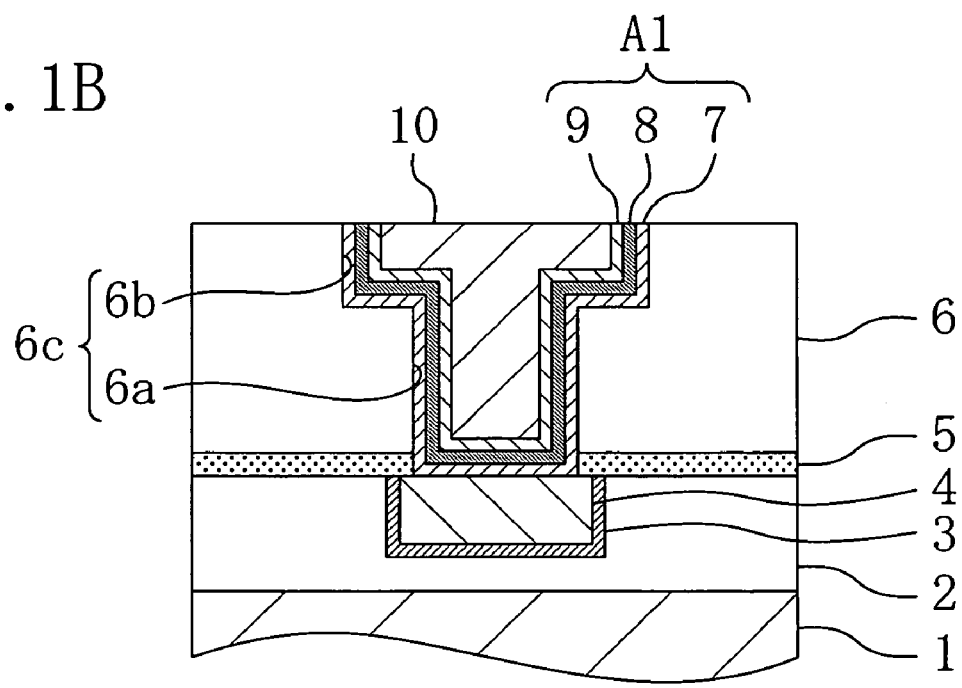

FIGS. 1(a) and 1(b) are cross-sectional view illustrating major part of a structure of a semiconductor device according to a first embodiment of the present invention.

First, as shown in FIG. 1(a), a first insulating film 2 is formed on a silicon substrate 1 and a first copper interconnect 4 including a first barrier metal film 3 is formed on the first insulating film 2. Note that transistors and the like, which are not shown in FIGS. 1(a) and 1(b), are formed over the silicon substrate 1. A diffusion barrier film 5 for preventing diffusion of copper and a second insulating film 6 are formed in this order over the first insulating film 2 and the first copper interconnect 4. A via hole 6a is formed in the diffusion barrier film 5 and the second insulating film 6 and an interconnect trench 6b is formed in the second insulating film 6. Thus, a recess portion 6c including the via hole 6a and the interconnect trench 6b is formed.

As shown in FIG. 1(a), a second barrier metal film A1 is formed on wall surfaces of the recess portion 6c. In this case, the second barrier metal film A1 is formed of a metal oxide film 7 formed over the second insulating film 6, a metal compound film 8 formed on the metal oxide film 7 and a metal film 9 formed on the metal compound film 8 so as to extend over wall surfaces of the recess portion 6c. The metal compound film 8 has larger elastic modulus than that of the metal oxide film 7. Note that at least part of the metal film 9 may be oxidized.

Furthermore, a copper film is formed on the metal film 9 by copper plating so as to fill the recess portion 6c, and then parts of the copper film and the second barrier metal film A1 which are other than parts thereof located inside of the recess portion 6c and are located on the second insulating film 6 are removed by CMP. Thus, a second copper interconnect 10 and a via plug which is part of the second copper interconnect 10 are formed. In this manner, a semiconductor device having the structure of FIG. 1(b) is formed. Note that the second copper interconnect 10 is formed of one or both of an interconnect line and a via hole. The second copper interconnect 10 may be formed of pure copper or copper alloy containing some other component (e.g., a slight amount of Si, Al, Mo, Sc or the like). A multilayer interconnect is formed by repeating process steps from the step of forming the diffusion barrier film 5 to the step of performing CMP.

In this case, as the diffusion barrier film 5, a silicon nitride film, a silicon nitride carbide film, a silicon carbide oxide film, a silicon carbide film or a lamination film made of a combination of those films is preferably used. The diffusion barrier film 5 has the function of preventing diffusion of copper in the first copper interconnect 4 into the second insulating film 6.

As the second insulating film 6, an insulating film made of a silicon oxide film, a fluorine doped silicon oxide film, a silicon oxide carbide film or an organic film is preferably used. These may be films formed by chemical vapor deposition and also may be SOD (spin on dielectric) films formed by spin coating.

The metal oxide film 7 does not have to have conductivity when the metal oxide film 7 has a small thickness. However, the metal oxide film 7 preferably has conductivity. Hereafter, the metal oxide film 7 having conductivity will be described in detail.

As a metal constituting the metal oxide film 7, an oxide film of a metal, such as ruthenium (Ru), iridium (Ir), molybdenum (Mo), osmium (Os), rhodium (Rh), platinum (Pt), vanadium (V), palladium (Pd) or the like, which does not lose its conductivity even when being oxidized. Note that as long as metal constituting the metal oxide film 7 is metal which does not lose its conductivity, some other metal than those described above may be used.

As a metal constituting the metal compound film 8, a high-melting point metal is preferably used. Thus, even when after formation of the second copper interconnect 10, heat at a temperature of around 400° C. is applied in the step of forming an upper layer interconnect, deformation of the metal compound film 8 such as cracks due to the thermal treatment does not occur. Therefore, a highly reliable semiconductor device can be achieved.

Furthermore, as the metal compound film 8, a nitride film of a high-melting point metal is preferably used.

Specifically, as the metal constituting the metal compound film 8, a nitride film made of a metal, such as titanium (Ti)-tantalum (Ta), zirconium (Zr), niobium (Nb), hafnium (Hf), tungsten (W), ruthenium (Ru), iridium (Ir), molybdenum (Mo), osmium (Os), rhodium (Rh), platinum (Pt), vanadium (V) or the like, which has an excellent mechanical strength and does not lose its conductivity even when being nitrided is preferably used. Note that as long as the metal constituting the metal oxide film 7 is a metal which does not lose its conductivity even when being nitrided, some other metal than those described above may be used. However, the metal constituting the metal compound film 8 has to be selected so that the metal compound film 8 has larger elastic modulus than that of the metal oxide film 7.

As the metal compound film 8, a carbide film made of a high-melting point metal can be used.

Specifically, as the metal constituting the metal compound film 8, a carbide film made of a metal, such as ruthenium (Ru), iridium (Ir), molybdenum (Mo), osmium (Os), rhodium (Rh), platinum (Pt), vanadium (V), titanium (Ti), tantalum (Ta), zirconium (Zr), niobium (Nb), hafnium (Hf), tungsten (W) or the like, which has an excellent mechanical strength and does not lose its conductivity even when being carbonized may be used. Note that as long as the metal constituting the metal compound film 8 is a metal which has an excellent mechanical strength and does not lose its conductivity even when being carbonized, some other metal than those described above may be used. However, the metal constituting the metal compound film 8 has to be selected so that the metal compound film 8 has larger elastic modulus than that of the metal oxide film 7.

As the metal compound film 8, a silicide film made of a high-melting point metal can be used.

Specifically, as the metal constituting the metal compound film 8, a silicide film made of a metal, such as ruthenium (Ru), iridium (Ir), molybdenum (Mo), osmium (Os), rhodium (Rh), platinum (Pt), vanadium (V)-titanium (Ti), tantalum (Ta)-zirconium (Zr), niobium (Nb), hafnium (Hf), tungsten (W) or the like, which has an excellent mechanical strength and does not lose its conductivity even when being silicidized may be used. Note that as long as the metal constituting the metal compound film 8 is a metal which has an excellent mechanical strength and does not lose its conductivity even when being silicidized, some other metal than those described above may be used. However, the metal constituting the metal compound film 8 has to be selected so that the metal compound film 8 has larger elastic modulus than that of the metal oxide film 7.

As the metal film 9, a metal, such as ruthenium (Ru), iridium (Ir), molybdenum (Mo), osmium (Os), rhodium (Rh), platinum (Pt), vanadium (V) or the like, which does not lose its conductivity even when being oxidized is preferably used. Note that as long as the metal constituting the metal film 9 is metal which has an excellent mechanical strength and does not lose its conductivity even when being oxidized, some other metal than those described above may be used.

Note that although not shown in FIGS. 1(a) and 1(b), an insulating film of a silicon oxide film (for example SiO2, SiOC, SiCO, SiON or the like), a silicon nitride film (for example, Si3N4, SiON, SiCN or the like), a silicon carbide film (for example, SiC, SiCO, SiOC, SiCN or the like) or the like may be formed between a surface of the second insulating film 6 and the metal oxide film 7 in a dual damascene interconnect trench (i.e., the recess portion 6c including the via hole 6a and the interconnect trench 6b).

Hereafter, a method for fabricating a semiconductor device according to the first embodiment of the present invention will be described with reference to FIGS. 2(a) through 2(c).

Figure 2A:
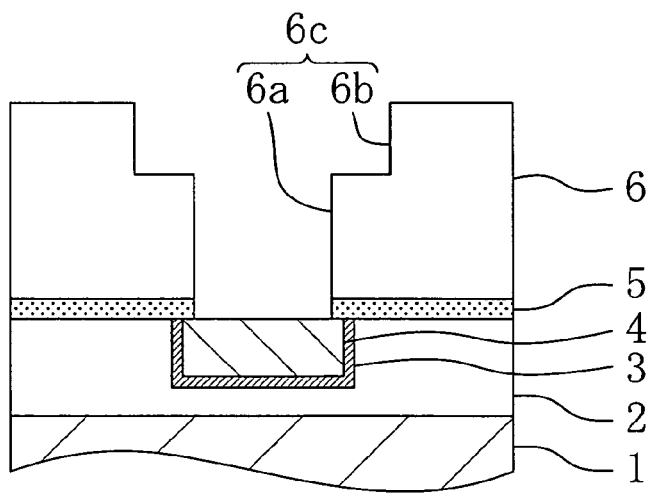
FIGS. 2(a) through 2(c) are cross-sectional views illustrating respective steps for fabricating a semiconductor device according to the first embodiment of the present invention.
Figure 2B:
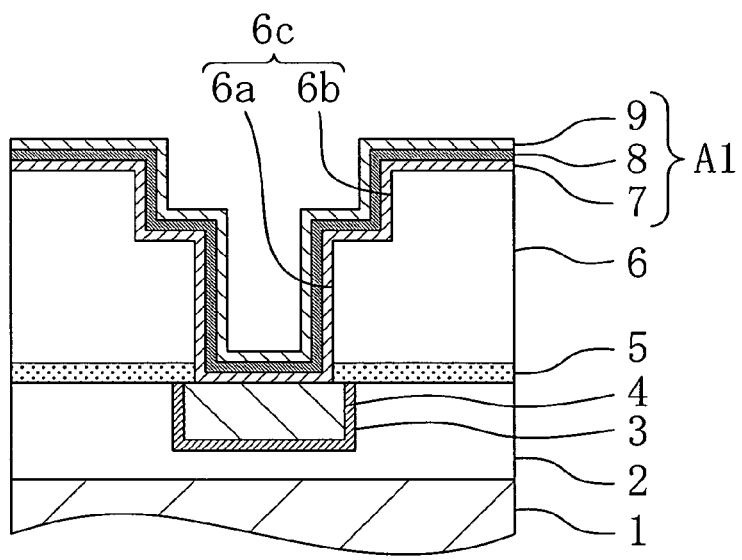
Figure 2C:
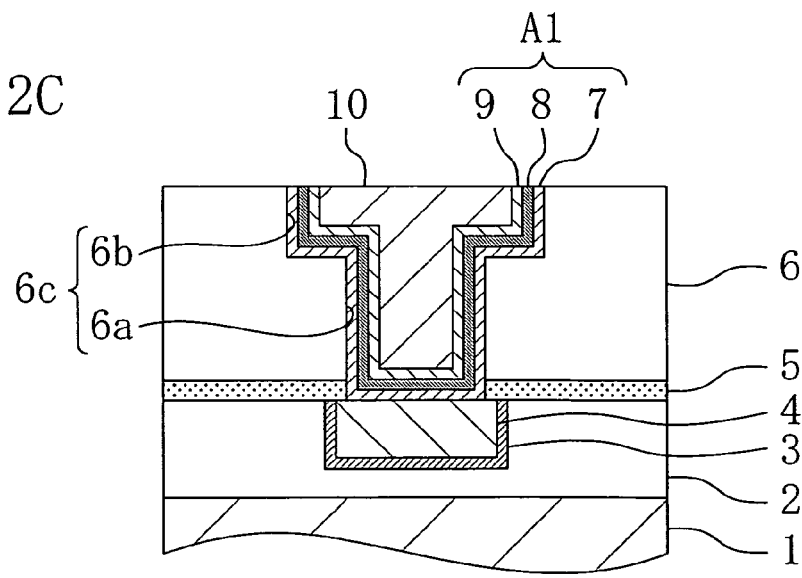

FIGS. 2(a) through 2(c) are cross-sectional views illustrating respective steps for fabricating a semiconductor device according to the first embodiment of the present invention.

First, as shown in FIG. 2(a), a first insulating film 2 is formed on a silicon substrate 1, and then a first copper interconnect 4 including a first barrier metal film 3 is formed on the first insulating film 2. Note that transistors and the like, which are not shown in FIGS. 2(a) and 2(b), are formed over the silicon substrate 1. Subsequently, a diffusion barrier film 5 for preventing diffusion of copper and a second insulating film 6 are formed in this order over the first insulating film 2 and the first copper interconnect 4. Then, a via hole 6a is formed in the diffusion barrier film 5 and the second insulating film 6 so that a bottom end of the via hole 6a reaches the first copper interconnect 4, and an interconnect trench 6b is formed in the second insulating film 6 so as to communicate to the via hole 6a. Thus, a recess portion 6c for dual damascene, which includes the via hole 6a and the interconnect trench 6b, is formed. In this case, the recess portion 6c including the via hole 6a and the interconnect trench 6b are preferably formed by, for example, a dual damascene formation method disclosed in Japanese Laid-Open Publication No. 2002-75994 using known lithography, etching, ashing and cleansing.

Next, as shown in FIG. 2(b), a metal oxide film 7 is formed on the second insulating film 6 so as to extend over wall surfaces of the recess portion 6c. Subsequently, a metal compound film 8 is formed on the metal oxide film 7. Then, a metal film 9 is formed on the metal compound film 8. In this case, the metal oxide film 7, the metal compound film 8 and the metal film 9 are preferably formed by ALD (atomic layer deposition), CVD (chemical vapor deposition), PVD (physical vapor deposition) or the like. Thus, a second barrier metal film A1 including the metal oxide film 7, the metal compound film 8 and the metal film 9 is formed.

Next, as shown in FIG. 2(c), a copper film is formed on the metal film 9 as well as the inside of the recess portion 6c by copper plating so as to fill the recess portion 6c, and then parts of the copper film, the metal film 9, the metal compound film 8 and the metal oxide film 7 which are other than parts thereof located inside of the recess portion 6c and are located on the second insulating film 6 are removed by CMP. Thus, a second copper interconnect 10 and a via plug which is part of the second copper interconnect 10 are formed. In this manner, a semiconductor device having the structure of FIG. 2(c) is formed. Note that, after formation of the a copper seed layer on the metal film 9, a copper film may be formed on the copper seed layer so that the recess portion 6c is filled and then CMP may be performed in the same manner as described above with reference to FIG. 1(b), thereby forming the second copper interconnect 10. In this case, because of addition of the step of forming the copper seed layer, more stable copper plating can be performed. Specifically, for example, even when part or all of a surface of the metal film 9 is oxidized, copper plating can be more stably performed by forming a copper seed layer. Also, when a buried interconnect of some other material than copper is formed, instead of the second copper interconnect 10 as a buried interconnect, a material for a seed layer corresponding to the material of the interconnect is appropriately selected.

Now, effects of the semiconductor device of the first embodiment of the present invention and the method for fabricating the semiconductor device will be hereafter described.

When a barrier metal film including a metal film and a metal oxide film is used as a barrier metal film, a mechanical strength of the metal oxide film is small and cracks are generated in the metal oxide film due to thermal treatment in process steps for fabricating a semiconductor device. If cracks are generated in the barrier metal film, reliability of the interconnect is reduced due to electro-migration or stress-migration. Furthermore, cracks are generated in the barrier metal film by stress applied thereto in performing wire bonding in the step of assembly, so that the reliability of the interconnect is reduced.

The second barrier metal film A1 of this embodiment includes the metal compound film 8 having larger elastic modulus than that of the metal oxide film 7 and an excellent mechanical strength between the metal oxide film 7 and the metal film 9. Thus, compared to a barrier metal film formed by merely stacking the metal film 9 and the metal oxide film 7, the mechanical strength of the second barrier metal film A1 is dramatically improved. Therefore, a highly reliable semiconductor device including a multilayer interconnect having an excellent mechanical strength can be achieved.

Furthermore, the second insulating film 6 and the metal oxide film 7 are formed so as to be in contact with each other and the metal film 9 and the copper interconnect 12 are formed so as to be in contact with each other. Since the second insulating film 6 and the metal oxide film 7 are in contact with each other, an adhesiveness between the second barrier metal film A1 and the second insulating film 6 is improved, compared to the case where the second insulating film 6 and the metal film 9 are in contact with each other. Furthermore, when an uppermost surface of the second insulating film 6 is an oxide, in each of the second insulating film 6 and the metal oxide film 7, a common element, i.e., oxygen exists. Thus, an adhesiveness between the second insulating film 6 and the metal oxide film 7 is increased. Also, since the metal film 9 and the second copper interconnect 10 are in contact with each other, a metal having a smaller resistance than that of the metal compound film 8 or the metal oxide film 7 serves as an electrode and a plating underlying layer in performing metal plating. Thus, a plating film having excellent uniformity in thickness can be formed, compared to the case where the metal compound film 8 or the metal oxide film 7 is formed on the surface of the second barrier metal film A1. Therefore, excellent metal plating can be realized.

Assume that a metal which does not lose its conductivity even when being oxidized is used as metal constituting the metal film 9. When a copper plating layer is directly deposited over the second barrier metal film A1, a uniform thickness of the plating layer can be achieved and a via hole can be filled by copper plating without the generation of voids. Therefore, a highly reliable semiconductor device including a multilayer interconnect having an excellent mechanical strength, a low resistance and an excellent adhesiveness with a substrate material can be achieved.

As has been described, in the semiconductor device of the first embodiment of the present invention and according to the method for fabricating the semiconductor device, a barrier metal film including a metal oxide film, a metal compound film having larger elastic modulus than those of the metal oxide film and a metal film stacked therein. Thus, a mechanical strength of the barrier metal film is increased. Therefore, a barrier metal film in which cracks due to thermal treatment in the step of semiconductor fabrication and stress in the step of assembly are not generated can be realized. Furthermore, an adhesiveness of the barrier metal film with an insulating film can be increased. Even when copper plating is performed directly to the barrier metal film, the barrier metal film having a uniform thickness can be achieved. Also, copper can be filled in the via hole without the generation of voids. Therefore, a highly reliable copper interconnect can be provided.

Hereafter, examples for resistivities of metals and metal compounds used in this embodiment will be shown.

A resistivity of ruthenium is 7.5 ($\mu\Omega \cdot$cm), a resistivity of iridium is 6.5 ($\mu\Omega \cdot$cm). Moreover, a resistivity of a ruthenium oxide film is 35 ($\mu\Omega \cdot$cm) and a resistivity of an iridium oxide film is 30 ($\mu\Omega \cdot$cm). A resistivity of a tantalum film which is normally used in at present is 60-180 ($\mu\Omega \cdot$cm) and a resistivity of a tantalum nitride film is 250 ($\mu\Omega \cdot$cm).

When the second barrier metal film A1 of this embodiment is incorporated in an actual semiconductor device, it is preferable that the metal oxide film 7 is formed so as to have a thickness of several nm to about 25 nm, the metal compound film 8 is formed so as to have a thickness of several nm to about 25 nm and the metal film 9 is formed so as to have a thickness of several nm to about 25 nm. In such a case, a thickness of the entire second barrier metal film A1 is preferably 20 nm to 30 nm in a 65 nm generation semiconductor device. In a 45 nm generation semiconductor device, it is predicted that a thickness of the entire second barrier metal film A1 has to be 15 nm or less at largest. Moreover, the film thickness ratio between the metal oxide film 7, the metal compound film 8 and the metal film 9 is arbitrarily optimized according to a film formation method and its application.

As has been described, according to the first embodiment of the present invention, a highly reliable semiconductor device including a multilayer interconnect having an excellent mechanical strength, a low resistance and an excellent adhesiveness can be achieved.

Note that a structure in which a plurality of second barrier metal films A1 are stacked between the second insulating film 6 and the second copper interconnect 10 may be used.

Unless an adhesiveness between the metal oxide film 7 and the metal compound film 8 is degraded, another single- or more-layer film may be provided between the metal oxide film 7 and the metal compound film 8. Also, unless an adhesiveness between the metal compound film 8 and the metal film 9 is degraded, another single- or more-layer film may be provided between the metal compound film 8 and the metal film 9.

Note that in this embodiment, the case where a dual damascene structure is adopted has been described. However, needless to say, even when a single damascene structure is adopted, the same effects as those in the case where a dual damascene structure is adopted can be achieved. When a single damascene structure is adopted, an interconnect and a via plug are formed in separate process steps. An interconnect and a via plug in this case are included in a buried interconnect which is the second copper interconnect 10 of this embodiment.

In this embodiment, the case where as a material for the buried interconnect, i.e., the second copper interconnect 10, copper or copper alloy is used has been described. As a more preferable embodiment, a metal, such as Ag, Au, Pt or the like, having a lower electric resistivity than that of copper or copper alloy of the metal is used as a material for the buried interconnect.

Second Embodiment

Hereafter, a semiconductor device according to a second embodiment of the present invention and a method for fabricating the semiconductor device will be described with reference to FIGS. 3(a) and 3(b) and FIGS. 4(a) through 4(c). Note that in the second embodiment, description of each member also shown in the first embodiment is not repeated. Hereafter, description will be made focusing on different points from the first embodiment.

Figure 3A:
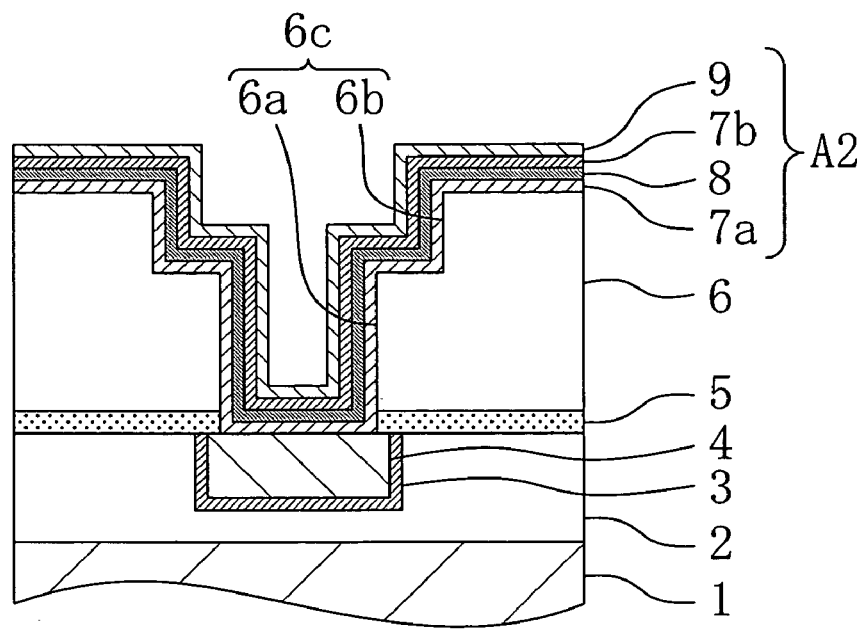
FIGS. 3(a) and 3(b) are cross-sectional views illustrating major part of a structure of a semiconductor device according to a second embodiment of the present invention.
Figure 3B:
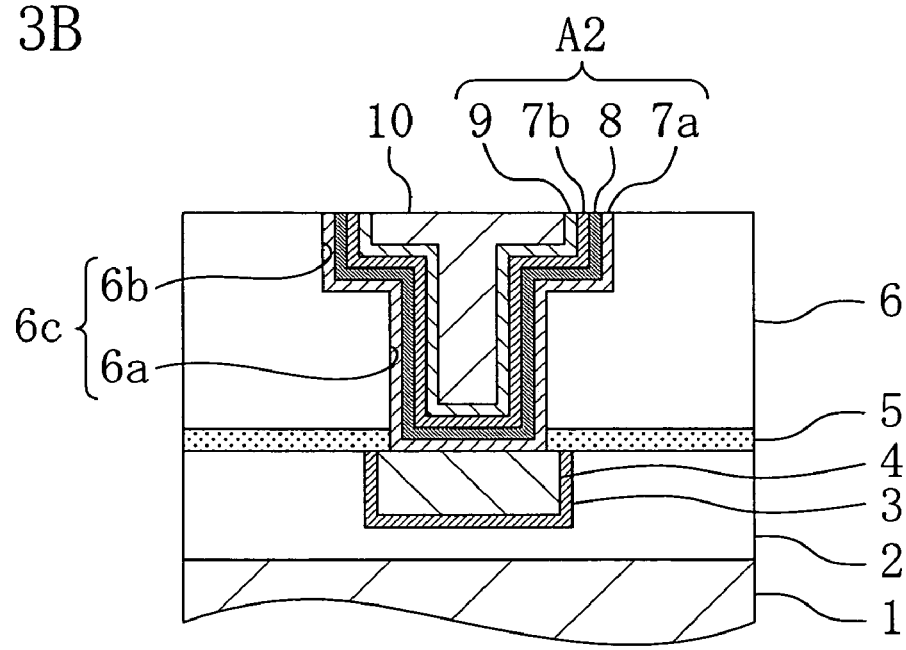

First, FIGS. 3(a) and 3(b) are cross-sectional views illustrating major part of a structure of a semiconductor device according to the second embodiment of the present invention.

In FIGS. 3(a) and 3(b), the second embodiment is different from the first embodiment in that a second barrier metal film A2 is formed on wall surfaces of the recess portion 6c and the second barrier metal film A2 includes a first metal oxide film 7a formed on the second insulating film 6, a metal compound film 8 formed on the first metal oxide film 7a, a second metal oxide film 7b formed on the metal compound film 8 and a metal film 9 formed on the second metal oxide film 7b so as to extend over the recess portion 6c. In this case, elastic modulus of the metal compound film 8 is larger than those of the first metal oxide film 7a and the second metal oxide film 7b.

As a metal constituting the first metal oxide film 7a and a metal constituting the second metal oxide film 7b, metals selected from types of the metal constituting the metal oxide film 7 described in the first embodiment are preferably used. The first metal oxide film 7a and the second metal oxide film 7b may be formed of the same type of metal or may be formed of different types of metal.

A metal constituting the metal compound film 8 has to be selected from the types of the metal constituting the metal compound film 8 described in the first embodiment so that the metal compound film 8 has larger elastic modulus than those of the first metal oxide film 7a and the second metal oxide film 7b.

Hereafter, a method for fabricating a semiconductor device according to the second embodiment of the present invention will be described with reference to FIGS. 4(a) through 4(c).

Figure 4A:
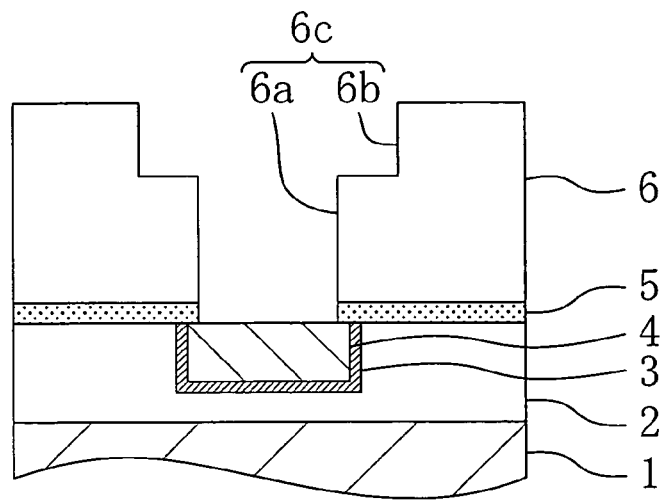
FIGS. 4(a) through 4(c) are cross-sectional views illustrating respective steps for fabricating a semiconductor device according to the second embodiment of the present invention.
Figure 4B:
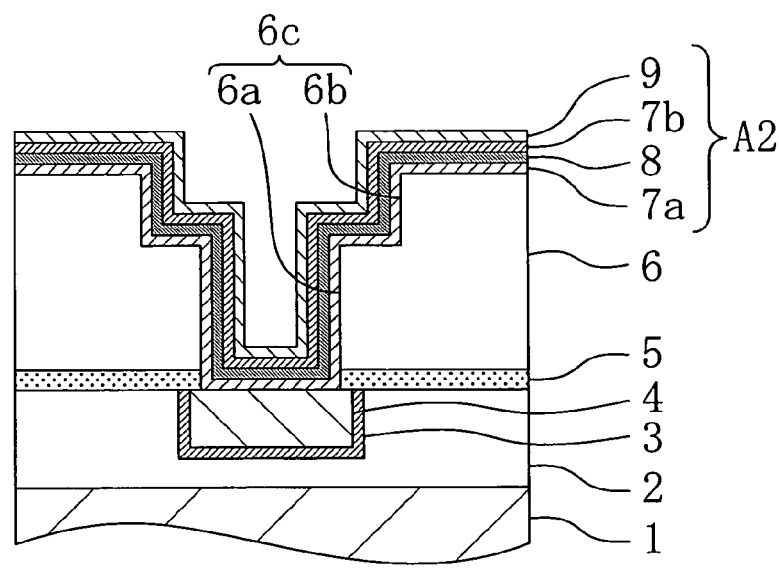
Figure 4C:
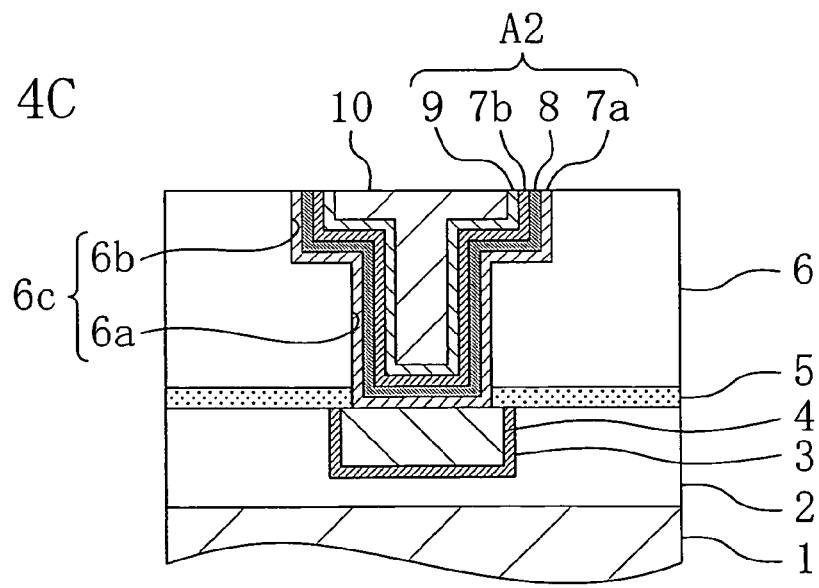
Figure 5A:
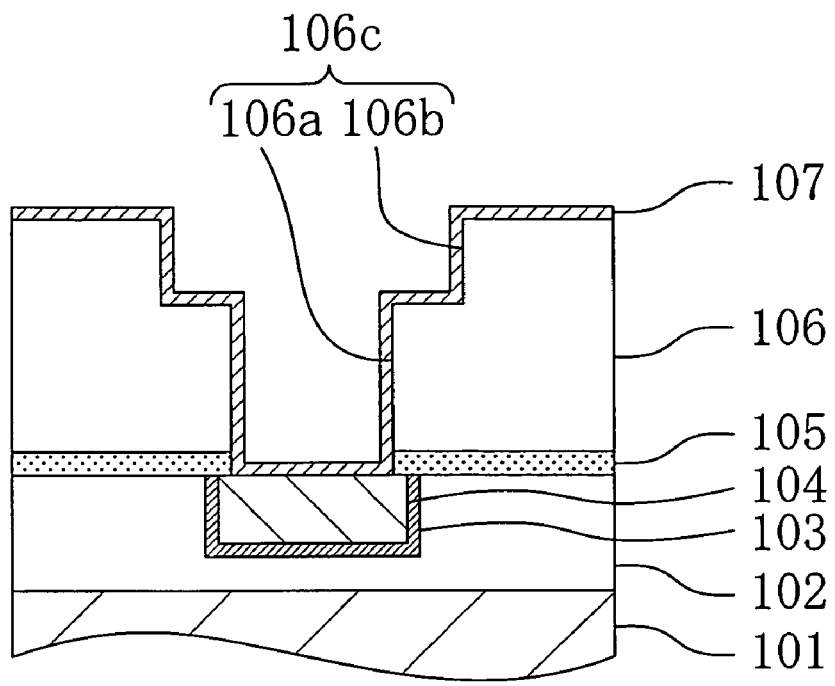
FIGS. 5(a) and 5(b) are cross-sectional views illustrating major part of a structure of a semiconductor device according to a known example.
Figure 5B:
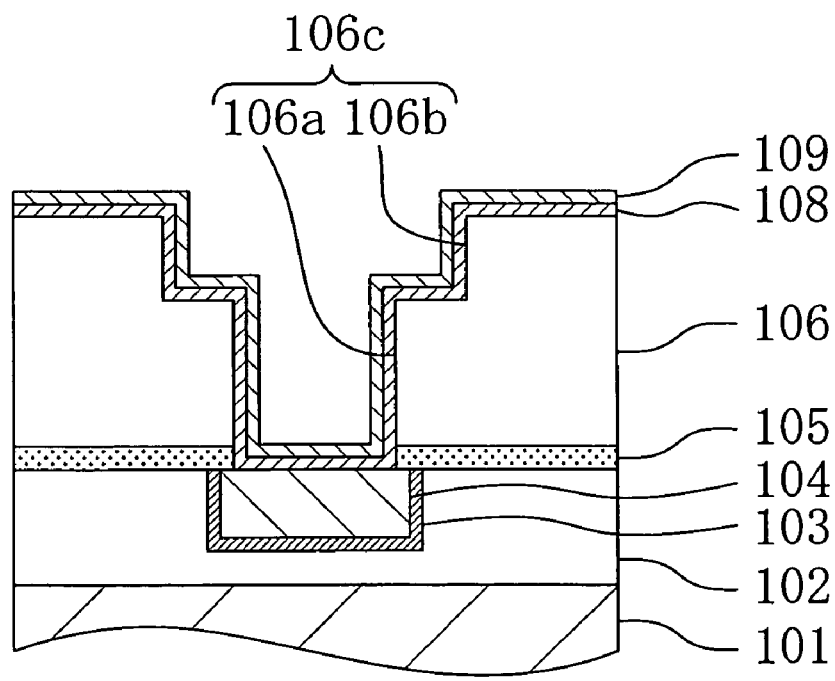

In FIGS. 4(a) through 4(c), the second embodiment is different from the first embodiment in that in the step shown in FIG. 4(b), a second barrier metal film A2 is formed. Specifically, as shown in FIG. 4(b), a first metal oxide film 7a is formed on a second insulating film 6 so as to extent over wall surfaces of a recess portion 6c. Subsequently, a metal compound film 8 is formed on the first metal oxide film 7a. A second metal oxide film 7b is formed on the metal compound film 8. Then, a metal film 9 is formed on the second metal oxide film 7b. In this case, the first metal oxide film 7a, the metal compound film 8, the second metal oxide film 7b and the metal film 9 are preferably formed by a film formation method such as ALD (atomic layer deposition), CVD (chemical vapor deposition) or PVD (physical vapor deposition). Thus, the second barrier metal film A2 including the first metal oxide film 7a, the metal compound film 8, the second metal oxide film 7b and the metal film 9 is formed.

Now, effects of the semiconductor device of the second embodiment of the present invention and the method for fabricating the semiconductor device will be hereafter described.

With the semiconductor device according to the second embodiment of the present invention and the method for fabricating the semiconductor device, the following effects, in addition to the effects obtained with the semiconductor device and the fabrication method of the first embodiment, can be achieved.

The second barrier metal film A2 includes the metal compound film 8 between the first metal oxide film 7a and the metal film 9 and the second metal oxide film 7b between the metal film 9 and the metal compound film 8. Also, the metal compound film 8 has larger elastic modulus than those of the first metal oxide film 7a and the second metal oxide film 7b, so that the second barrier metal film A2 having an excellent mechanical strength can be achieved. Thus, compared to a barrier metal film formed by merely stacking a metal film and a metal oxide film, the mechanical strength of the second barrier metal film A2 is dramatically improved. Furthermore, even when the metal compound film 8 has a different thermal expansion coefficient from that of each of the first metal oxide film 7a and the second metal oxide film 7b, thermal expansion of the entire second barrier metal film A2 is made uniform, so that a structure of the second barrier metal film A2 having an excellent mechanical strength can be realized. Moreover, the first metal oxide film 7a, the metal compound film 8 and the second metal oxide film 7b are stacked in this order to form the second barrier metal film A2. Thus, stress applied to the first metal oxide film 7a is dispersed into two layers, so that the mechanical strength of the entire second barrier metal film A2 is dramatically increased. Specifically, when the first metal oxide film 7a and the second metal oxide film 7b are formed of the same metal material, the mechanical strength is further increased. Therefore, a highly reliable semiconductor device including a multilayer interconnect having an excellent mechanical strength can be achieved.

Furthermore, the second insulating film 6 and the first metal oxide film 7a are formed so as to be in contact with each other and the metal film 9 and the second copper film 10 are formed so as to be in contact with each other. Since the first metal oxide film 7a and the second insulating film 6 are in contact with each other, an adhesiveness between the second barrier metal film A2 and the second insulating film 6 is improved, compared to the case where the metal film 9 and the second insulating film 6 are in contact with each other. Furthermore, when an uppermost surface of the second insulating film 6 is an oxide, in each of the first metal oxide film 7a and the second insulating film 6, a common element, i.e., oxygen exists. Thus, an adhesiveness between the second insulating film 6 and the first metal oxide film 7a is increased. Also, since the metal film 9 and the second copper film 10 are in contact with each other, a metal having a smaller resistance than that of the metal compound film 8, the first metal oxide film 7a, or the second metal oxide film 7b serves as an electrode and a plating underlying layer in performing metal plating. Thus, a plating film having excellent uniformity in thickness can be formed, compared to the case where the metal compound film 8, the first metal oxide film 7a or the second metal oxide film 7b is located on the surface of the second barrier metal film A2. Therefore, excellent metal plating can be realized.

Note that a structure in which a plurality of second barrier metal films A2 are stacked between the second insulating film 6 and the second copper interconnect 10 can be used.

Unless an adhesiveness between the first metal oxide film 7a and the metal compound film 8 is degraded, another single- or more-layer film may be provided between the first metal oxide film 7a and the metal compound film 8. Also, unless an adhesiveness between the second metal oxide film 7b and the metal film 9 is degraded, another single- or more-layer film may be provided between the second metal oxide film 7b and the metal film 9. Moreover, unless an adhesiveness between the metal compound film 8 and the second metal oxide film 7b is degraded, another single- or more-layer film may be provided between the metal compound film 8 and the second metal oxide film 7b.

INDUSTRIAL APPLICABILITY

As has been described, the present invention is useful for a semiconductor device including a barrier metal film having an excellent mechanical strength, a low resistance and an excellent adhesiveness and a method for fabricating the semiconductor device.

The invention claimed is:

1. A semiconductor device including an insulating film formed on a substrate, a buried metal interconnect formed in the insulating film, and a barrier metal film formed between the insulating film and the metal interconnect, characterized in that the barrier metal film includes a metal oxide film, a metal compound film and a metal film stacked in this order from a side in which the insulating film exists to a side in which the metal interconnect exists, and elastic modulus of the metal compound film is larger than that of the metal oxide film.

2. The semiconductor device of claim 1, characterized in that the insulating film and the metal oxide film are formed so as to be in contact with each other, and the metal film and the metal interconnect are formed so as to be in contact with each other.

3. The semiconductor device of claim 1, characterized in that the metal oxide film has conductivity.

4. The semiconductor device of claim 1, characterized in that a metal constituting the metal compound film is a high-melting point metal.

5. The semiconductor device of claim 1, characterized in that a metal constituting the metal film is a metal which does not lose its conductivity even when being oxidized.

6. The semiconductor device of claim 1, characterized in that the metal compound film is formed of a metal nitride film.

7. The semiconductor device of claim 1, characterized in that the metal compound film is formed of a metal carbide film.

8. The semiconductor device of claim 1, characterized in that the metal compound film is formed of a metal silicide film.

9. A semiconductor device including an insulating film formed over a substrate, a buried metal interconnect formed in the insulating film, and a barrier metal film formed between the insulating film and the metal interconnect, characterized in that the barrier metal film includes a first metal oxide film, a metal compound film, a second metal oxide film and a metal film stacked in this order from a side in which the insulating film exists to a side in which the metal interconnect exists, and elastic modulus of the metal compound film is larger than those of the first metal oxide film and the second metal oxide film.

10. The semiconductor device of claim 9, characterized in that the insulating film and the first metal oxide film are formed so as to be in contact with each other, and the metal film and the metal interconnect are formed to be in contact with each other.

11. The semiconductor device of claim 9, characterized in that at least one of the first metal oxide film and the second metal oxide film has conductivity.

12. The semiconductor device of claim 9, characterized in that a metal constituting the metal compound film is a high-melting point metal.

13. The semiconductor device of claim 9, characterized in that a metal constituting the metal film is a metal which does not lose its conductivity even when being oxidized.

14. The semiconductor device of claim 9, characterized in that the metal compound film is formed of a metal nitride film.

15. The semiconductor device of claim 9, characterized in that the metal compound film is formed of a metal carbide film.

16. The semiconductor device of claim 9, characterized in that the metal compound film is formed of a metal silicide film.

17. A method for fabricating a semiconductor device, characterized by comprising the steps of forming a recess portion in an insulating film on a substrate;

forming a barrier metal film including a metal oxide film, a metal compound film and a metal film stacked in this order so that the barrier metal film extends over wall surfaces of the recess portion; and forming a buried metal interconnect on the barrier metal film so that the recess portion is filled, and that the step of forming the barrier metal film includes a sub-step of forming the metal compound film having larger elastic modulus than that of the metal oxide film.

18. The semiconductor device of claim 17, characterized by further comprising, after the step of forming the barrier metal film and before the step of forming the buried metal interconnect, the step of forming a seed layer on the barrier metal film, and that the step of forming the buried metal interconnect includes a sub-step of forming the burrier metal interconnect on the seed layer.

19. A method for fabricating a semiconductor device, characterized by comprising the steps of:

forming a recess portion in an insulating film on a substrate;

forming a barrier metal film including a first metal oxide film, a metal compound film, a second metal oxide film and a metal film stacked in this order so that the barrier metal film extends over wall surfaces of the recess portion; and forming a buried metal interconnect on the barrier metal film so that the recess portion is filled, and that the step of forming the barrier metal film includes a sub-step of forming the metal compound film having larger elastic modulus than those of the first metal oxide film and the second metal oxide film.

20. The method of claim 19, characterized by further comprising, after the step of forming the barrier metal film and before the step of forming the buried metal interconnect, the step of forming a seed layer on the barrier metal film, and that the step of forming the buried metal interconnect includes a sub-step of forming the burrier metal interconnect on the seed layer.

* * * * *

UNITED STATES PATENT AND TRADEMARK OFFICE
CERTIFICATE OF CORRECTION

| | | |
|---|---|---|
| PATENT NO. | : 7,663,239 B2 | Page 1 of 1 |
| APPLICATION NO. | : 11/630799 | |
| DATED | : February 16, 2010 | |
| INVENTOR(S) | : Atsushi Ikeda et al. | |

It is certified that error appears in the above-identified patent and that said Letters Patent is hereby corrected as shown below:

On the title page of the patent,

In Item "(87) PCT Pub. Date: Dec. 1, 2006", change "Dec. 1, 2006" to --Jan. 12, 2006--

Signed and Sealed this

Second Day of November, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,663,239 B2 | Page 1 of 1 |
| APPLICATION NO. | : 11/630799 | |
| DATED | : February 16, 2010 | |
| INVENTOR(S) | : Ikeda et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 632 days.

Signed and Sealed this

Thirtieth Day of November, 2010

David J. Kappos
*Director of the United States Patent and Trademark Office*